US006352916B1

United States Patent
Tang et al.

(10) Patent No.: US 6,352,916 B1
(45) Date of Patent: Mar. 5, 2002

(54) METHOD OF FORMING PLUGS IN MULTI-LEVEL INTERCONNECT STRUCTURES BY PARTIALLY REMOVING CONDUCTIVE MATERIAL FROM A TRENCH

(75) Inventors: Sanh D. Tang; Rajendra Narasimhan, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/432,516

(22) Filed: Nov. 2, 1999

(51) Int. Cl.[7] .......................................... H01L 21/4763
(52) U.S. Cl. ....................... 438/622; 438/637; 438/672; 438/688
(58) Field of Search ................................. 438/622, 637, 438/669, 672, 674, 675, 688, 679, 430

(56) References Cited

U.S. PATENT DOCUMENTS

| 5,539,255 A | * | 7/1996 | Cronin |
| 5,596,230 A | * | 1/1997 | Hong |
| 5,767,012 A | * | 6/1998 | Fulford, Jr. et al. |
| 5,846,881 A |   | 12/1998 | Sandhu et al. ............. 438/683 |
| 5,886,411 A | * | 3/1999 | Kohyama |
| 6,083,824 A | * | 7/2000 | Tsai et al. |
| 6,087,251 A | * | 7/2000 | Hsu |

OTHER PUBLICATIONS

C. Yu, M. Grief, and T. T. Doan, "Submicron Aluminum Plug Process Utilizing High Temperature Sputtering and Chemical Mechanical Polishing," Conference Proceedings of ULSI—VII, Materials Res. Soc., pp. 519–525, 1992.*

* cited by examiner

Primary Examiner—Charles Bowers
Assistant Examiner—Stephen W. Smoot
(74) Attorney, Agent, or Firm—Charles Brantley

(57) ABSTRACT

In a semiconductor device, a conductive structure comprising an interconnect and an overlying plug integrally extending therefrom is provided. The structure can be provided by a damascene process, wherein an opening is defined in insulation deep enough to accommodate the height of an interconnect and its overlying plug. The opening is filled with metal, and non-plug areas of the metal are then recessed down to a standard interconnect height within the trench. The full height of the metal is retained at the plug site. Oxide is then deposited over the recessed portions. Alternatively, a continuous metal layer is provided that is deep enough to accommodate the height of an interconnect and its overlying plug. The metal is then etched to form the interconnect/plug structure, and insulation is deposited thereover. Multiple structures may be provided at the same level using these processes, and multiple levels of these structures may be similarly provided.

11 Claims, 14 Drawing Sheets

METHOD OF FORMING PLUGS IN MULTI-LEVEL INTERCONNECT STRUCTURES BY PARTIALLY REMOVING CONDUCTIVE MATERIAL FROM A TRENCH

TECHNICAL FIELD

The present invention relates generally to metallization processes used in integrated circuit manufacture. More specifically, the current invention relates to methods of forming a via for electrical communication between multiple levels of interconnects and the devices resulting therefrom.

BACKGROUND OF THE INVENTION

In processing integrated circuits, it is important to be able to establish electrical communication between conductive elements at different locations within a circuit. These elements often take the form of conductive lines or paths known as "interconnects" due to their function of electrically interconnecting circuit nodes. Interconnects at different elevations will be separated by at least one insulation layer, such as an interlayer dielectric. Thus, providing electrical communication between such interconnects will often involve (1) forming the lower interconnect; (2) layering insulation over the lower interconnect; (3) defining an opening, often called a "via," through the insulation and leading to the lower interconnect; (4) using a conductive material to fill the via, in which case the conductive material may be referred to as a "plug;" and (5) forming the higher interconnect over the plug.

On a larger scale, it should be appreciated that there are often several interconnects at any particular level of a circuit device. Further, one should note that, while one lower level interconnect may need to connect to one higher interconnect at one point, a second lower level interconnect may need to contact a second higher interconnect at a different point. As a result, after the lower level of interconnects have been formed and covered with insulation, a particular pattern of vias are formed in the insulation.

Forming these vias entails etching through the insulation in areas exposed by an overlying patterned mask. Ideally, the etch stops once the lower level of interconnects is reached and before any of the conductive material of that level is etched. In reality, however, the top of the interconnects suffer some degree of etching at the exposure. Polymer may be formed as a result of etching this conductive material. The presence of polymer may interfere with further processing and, therefore, at least one cleaning step may be needed to remove the polymer. Even with cleaning, however, some polymer may remain. The presence of the polymer may then interfere with communication between the plug and the subsequently formed upper interconnect.

Another problem occurs as a result of the constant need in the art to make ever-smaller semiconductor devices to allow a more efficient use of the silicon substrate from which such devices are fabricated. This need requires the widths of features, including vias, to become narrower with each generation of devices. However, a layer of insulation must maintain a minimum vertical distance between upper and lower conductive members; if the insulation between the two such members is too thin, an intolerably high level of capacitance will be generated between the members and interfere with their desired operation. Thus, as circuit dimensions continue to scale down, the width of the via decreases, but its depth, determined by the required thickness of the insulation, must remain generally the same. In other words, the aspect ratio of the via increases as the critical lateral dimensions of devices shrink. Unfortunately, high aspect ratios associated with a via make it difficult to ensure that the via has been completely filled with the conductive plug material. Gaps in the plug will degrade the plug's ability to allow electrical communication between conductive members.

Also of note is the fact that each discrete deposition of one conductor on another represents a potential disruption in continuity of conductive material which, in turn, affects the ability to allow electrical communication. Separate deposition steps may allow contaminants to accumulate between those steps. Further, depositing one kind of conductive material onto a different kind may hamper electrical conductivity. Even assuming that the same type of material is deposited in two separate steps and that contaminants are kept to an absolute minimum, there may still be spaces between the discretely deposited layers that would not exist if the two layers had been deposited as one. All of these factors can adversely affect electrical communication between interconnects at different levels. Specifically, these problems can occur at both the lower level interconnect/plug interface and the plug/higher level interconnect interface.

Thus, there is a need in the art to provide electrical communication between conductive elements while at least reducing the problems discussed above. It would also be desirable to be able to reduce the number of deposition steps needed to provide conductive elements and a connector between them.

SUMMARY OF THE INVENTION

Accordingly, at least some exemplary embodiments of the current invention provide methods of connecting conductive elements and further provide the structures resulting from those methods. In one exemplary embodiment, a trench is etched in a layer of insulation or dielectric, wherein the trench is deep and long enough to accommodate an interconnect as well as a plug or other interlayer electrical connection configured to contact a later-formed interconnect at a higher elevation. The entire trench is filled with conductive material. In an area that is not designated as a plug site, the height of the conductive material is reduced. In an area that is designated as a plug site, the height of the conductive material is retained. The recessed portion of conductive material is then covered with additional insulation. Another interconnect may then be formed over the insulative materials so that it contacts the plug. Other embodiments involve etching a plurality of trenches at one level of a semiconductor device, wherein the trenches are deep enough to accommodate interconnects as well as plug sites anywhere along each trench.

Another exemplary embodiment comprises etching at least one plug/interconnect structure from a continuous layer of metal and then depositing insulation around the structure or structures.

Still another exemplary embodiment comprises using at least one of the processes described above to create multiple levels of interconnects.

Yet other embodiments address the in-process apparatus or final product resulting from these and other processes. Such exemplary embodiments include a conductive structure such as an interconnect that is integral to or is continuous with a plug structure configured to contact a higher interconnect.

DETAILED DESCRIPTION OF THE PREFERRED EMBODIMENTS

Figure 1A:
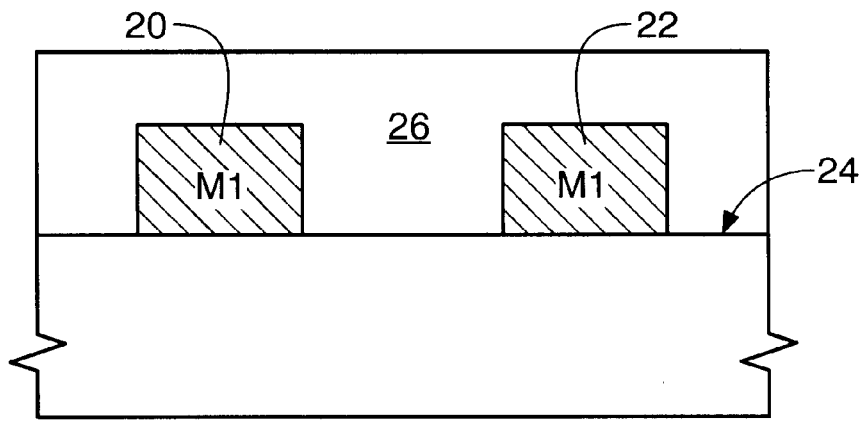
FIGS. 1A, 1B, 2, and 3 depict an in-process device undergoing processes known in the art.
Figure 1B:
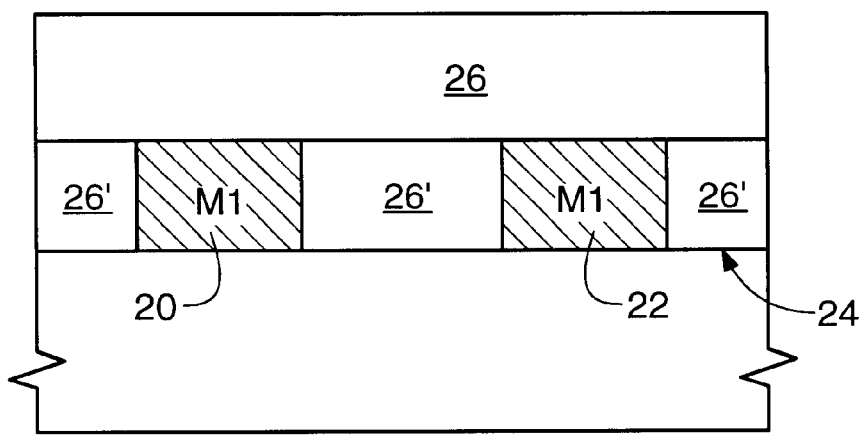
Figure 2:
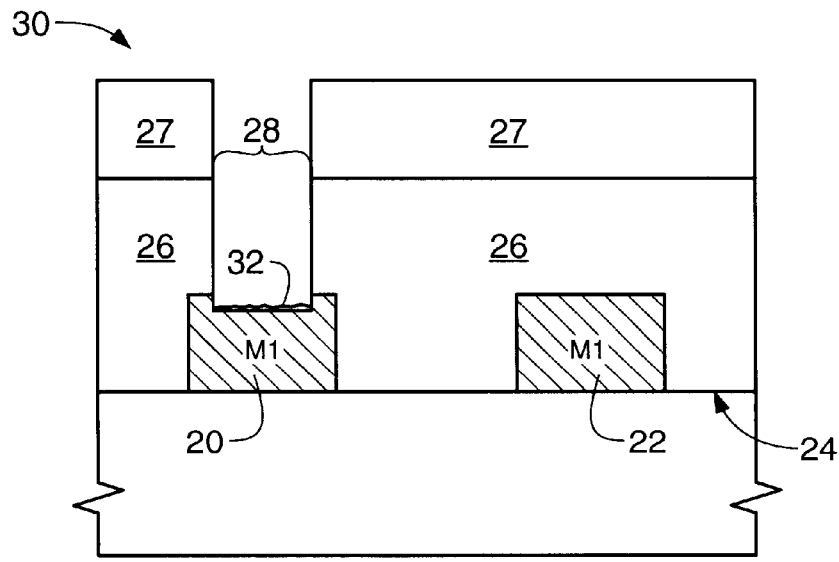
Figure 3:
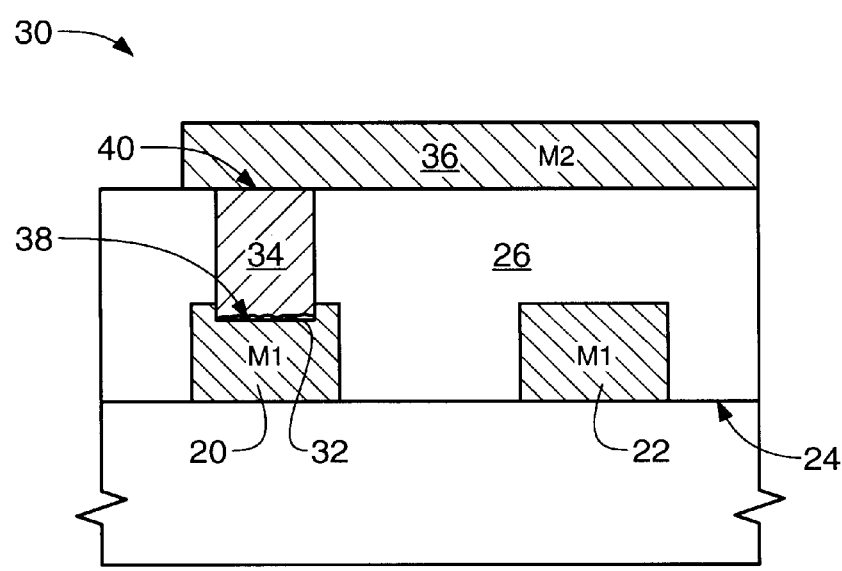

FIGS. 1–3 offer a brief review of the prior art discussed above in order to more clearly distinguish exemplary embodiments of the current invention. FIG. 1A illustrates that interconnects 20 and 22 are provided over a surface 24. This surface 24 may define the top of an insulation layer, in which case there may be plugs leading up to the interconnects from lower-level interconnects. These plugs and interconnects are not shown in FIG. 1A for the sake of clarity. The surface 24 could also represent a semiconductor substrate. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above. Moreover, it is understood that a semiconductor device may comprise conductive and insulative materials as well as a semiconductive material.

As for the interconnects 20, 22 themselves, they can be formed out of the same conductive material which, in turn, can be provided to both interconnect sites in a common deposition step. For example, one skilled in the art can deposit a continuous conductive layer; etch the desired interconnect features 20, 22 from that layer; and then deposit insulation 26 over the interconnects 20, 22. Alternatively, as seen in FIG. 1B, a damascene process may be used, wherein at least a portion of insulation 26' is deposited; trenches are etched into the portion of insulation 26', wherein the trenches define sites for interconnects 20 and 22; conductive material is deposited into the trenches; and any overflow of conductive material is etched or planarized away. The "M1" designation on interconnects 20 and 22 indicates that both interconnects 20, 22, are metal and further resulted from the same metal deposition step. Specifically, interconnects 20, 22 resulted from the first metal deposition step, hence the term "M1." An exemplary height of these interconnects 20, 22 is 5,000 Angstroms. Accordingly, the portion of insulation 26' used to define the interconnect sites is also about 5,000 Angstroms thick. Additional amounts of insulation 26 may then be added over the filled trenches to achieve the state of the in-process device depicted in FIG. 1B. As an exemplary amount, the additional insulation 26 may add another 3,000 Angstroms to the thickness of insulation 26, resulting in a maximum thickness of 8,000 Angstroms in areas extending to the surface 24. As an exemplary material, borophosphosilicate glass (BPSG) may serve as insulation 26 and 26'.

Regardless of the method used provide interconnects covered in insulation, the next step in the prior art is to etch vias in areas where it is desired to allow contact between an existing interconnect and an interconnect to be formed later at a higher elevation. This step is illustrated in FIG. 2. At the particular cross-section illustrated in that figure, it is desired to contact interconnect 20 but not interconnect 22. As a result, only one via 28 is etched at this point in the in-process device 30. This via etch is guided by a patterned mask 27, provided over insulation 26. Patterned mask 27 covers the insulation 26 over interconnect 22 but has an opening allowing the etching of via 28 over interconnect 20. Unfortunately, etching the via 28 through the insulation 26 may also result in etching at least a portion of interconnect 20. Etching the conductive material of interconnect 20 may then result in the formation of polymer 32 or other residue.

Even if steps are taken to clean the via 28 of polymer 32, some polymer 32 may be present in the via 28 when the plug 34 is subsequently deposited, as seen in FIG. 3. Thus, when interconnect 36 is formed over plug 34 as part of a second metal deposition step "M2", the polymer 32 may interfere with electrical communication between interconnects 20 and 36. What should also be noted is the fact that the prior art method of achieving this structure involves three different depositions of conductive material: one for a lower level of interconnects (such as 20 and 22); one for the plug 34; and one for a higher level of interconnects (such as 36). As a result, there are two interfaces 38, 40, one representing the boundary between interconnect 20 and plug 34; and a second representing the boundary between plug 34 and interconnect 36. Problems discussed in the Background section may be associated with these two interfaces 38, 40.

Figure 4:
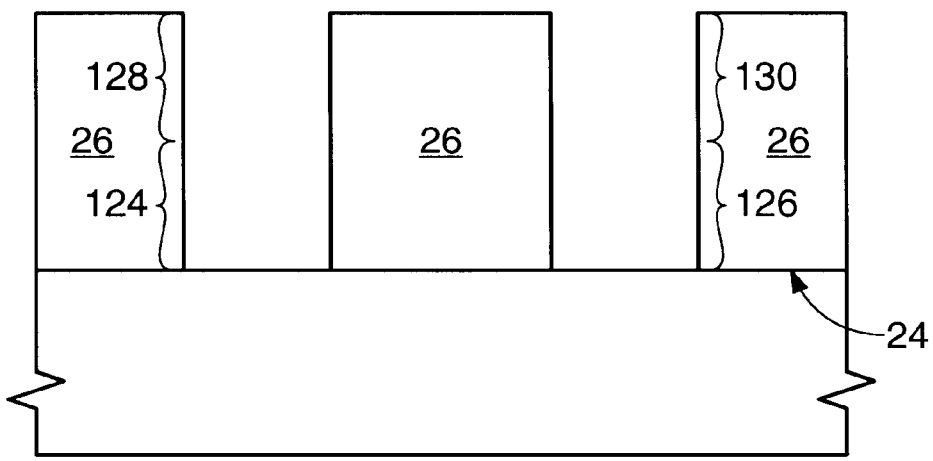
FIGS. 4–8B illustrate a first exemplary embodiment of the current invention, with FIGS. 4, 5, 6A, 7A and 8A offering cross-sectional views, while FIGS. 6B, 7B, and 8B offer top-down views.

FIG. 4 illustrates a first stage in an exemplary embodiment of the current invention that reduces if not eliminates such problems. Rather than separately defining interconnect sites and via sites, FIG. 4 discloses providing at least one trench in sufficiently thick insulation 26, wherein each trench's height encompasses an interconnect site (such as 124 or 126) as well as any overlying plug site (such as 128 or 130) regardless of whether a plug will ultimately appear at those plug sites. For purposes of explaining exemplary embodiments of this invention, the term "site" is understood to designate a region where a structure was, is, or is to be located.

The trench etch may be performed by any known technique. It may be desirable to use a process that will selectively etch the insulation 26 to the exclusion of the material used for surface 24. It may also be preferable to use an anisotropic etch so that the trenches will have a vertical sidewall, which allows for denser packing of devices. Assuming the insulation 26 is BPSG, exemplary etch parameters include flowing equal amounts of $CF_4$ and $CHF_3$ into a magnetically enhanced reactive ion etch chamber. The chamber pressure should be about 200 mTorr, the chamber temperature can be at room temperature, the applied magnetic field should be about 50 Gauss, and the applied RF energy should be between 600 W and 1000 W. A patterned mask over the BPSG can determine where the trenches are etched, and the BPSG should be etched under these conditions for at least enough time to reach the surface 24.

Figure 5:
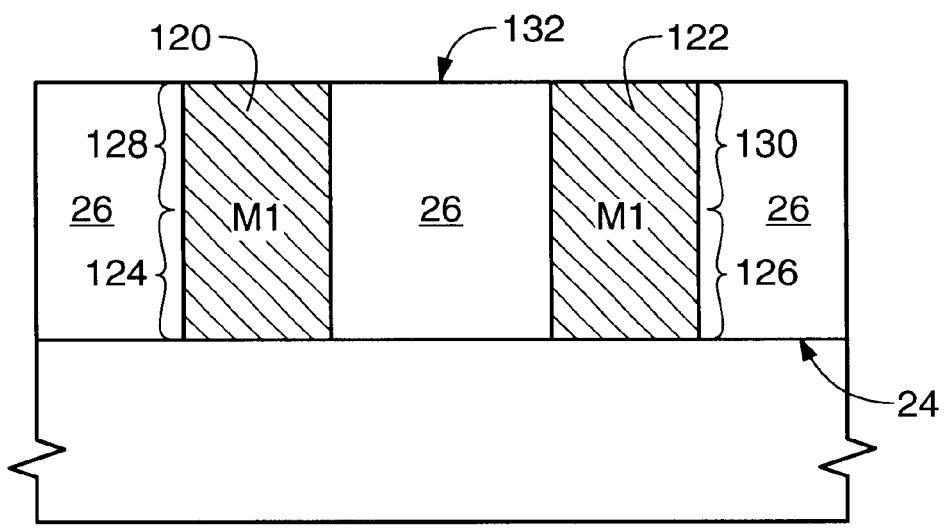

A conductive material is then deposited into each trench, and the resulting conductive structures 120, 122 can be seen in FIG. 5. In this exemplary embodiment, the conductive structures 120, 122 are made of metal. Moreover, the conductive structures 120, 122 are made of the same metal and result from the same metal deposition step as indicated once again by the "M1" designation. As an exemplary metal, tungsten could be deposited. Exemplary parameters of a tungsten CVD process involve reacting tungsten hexafluoride ($WF_6$) with silane ($SiH_4$) at a pressure of about 4.5 Torr and a temperature of about 450° C. Regardless of the specific deposition process, it continues at least until the trenches are filled. Any metal deposited onto the top of insulation 26 can be removed through etching or by way of planarization techniques, including abrasive planarization methods such as chemical-mechanical planarization (CMP). As an alternative to depositing tungsten, aluminum could be deposited by sputtering, chemical vapor deposition (CVD), or other methods known in the art.

Focusing briefly on sputtering aluminum in a damascene process such as the one described above, it should be noted that exemplary embodiments of the current invention that do so have an advantage over prior art methods that do so. To ensure that a trench is adequately filled with sputtered aluminum, it is desirable to sputter at a high temperature. This allows aluminum to better flow into the trench. Unfortunately, the high temperature also results in a rough surface. In the prior art, an additional (and therefore undesirable) planarization step is necessary to remedy this. To avoid the additional planarization step, prior art methods sputter aluminum into the trench at a relatively low temperature (480° C.) at the risk of poor trench-fill. Some exemplary embodiments of the current invention, however, already comprise a planarization step to achieve the inprocess structure depicted in FIG. 5. As a result, nothing is lost by sputtering aluminum at a high temperature (ranging from 510° C. to 520° C., for example), and a more reliable trench-fill process is gained.

The resulting conductive structures 120, 122 serve as interconnects or other conductive lines or paths. In addition, the conductive structures 120, 122 also provide conductive material for plugs that may be desired anywhere along those paths. Further, because such plugs will be defined along with the interconnects, the result will be a continuous and homogeneous electrically conductive structure including one part extending from one surface 24 to a more elevated surface 132, where other interconnects could be formed. Accordingly, the height of these conductive structures generally matches the thickness of the insulation 26—here assumed to be 8,000 Angstroms.

In areas where plugs are not desired, excess conductive material may be removed from those areas while still retaining enough conductive material to serve as an interconnect. For example, it is assumed that no plug is desired for conductive structure 122 at the particular cross-section displayed in FIG. 5, even though a plug site 130 has been etched and filled with metal along with interconnect site 126. It is further assumed that, while a plug is desired for conductive structure 120 at FIG. 5's particular cross-section, plugs may not be desired at other cross-sections for that conductive structure 120.

Figure 6A:
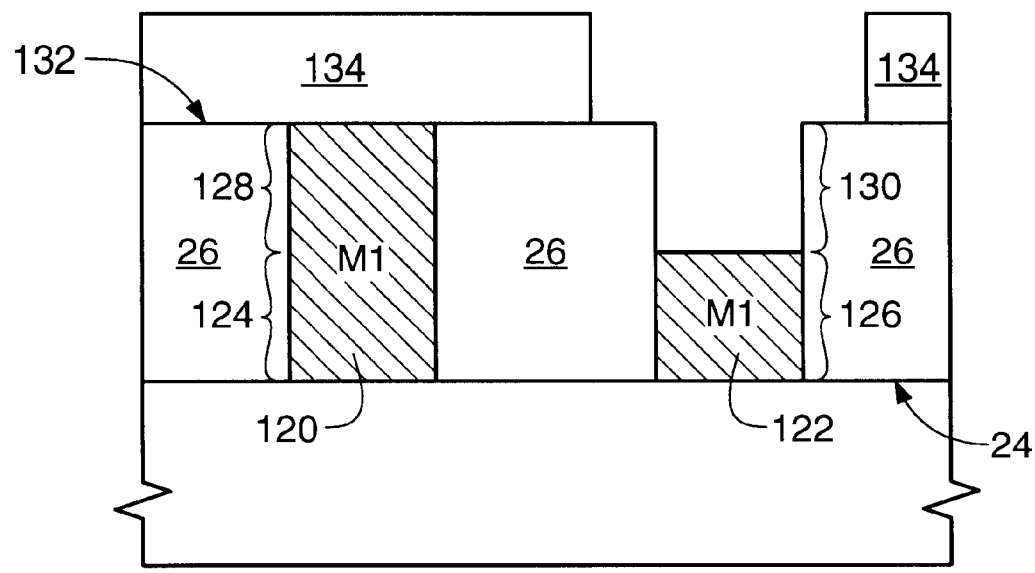
Figure 6B:
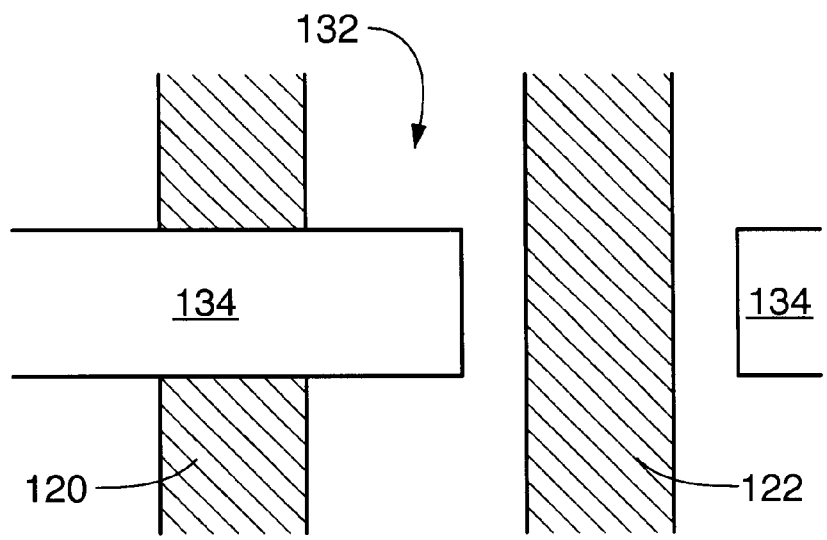

Thus, in order to isolate portions of conductive structures 120, 122 from the elevated surface 132, FIGS. 6A and 6B demonstrate that a patterned mask 134 is provided over the elevated surface 132, wherein areas of conductive structures 120 and 122 that should not extend to the elevated surface 132 are exposed. On the other hand, portions of structures that are to extend to the elevated surface 132 (such as plug site 128 of structure 120) are protected by the mask 134. The result is a mask 134 defining a pattern that is generally inverse to the patterned mask 27 used to define the prior art vias 28 in FIG. 2. The prior art pattern, however, requires a mask opening that corresponds to the width of the via 28. Because the narrowest possible via is desired for purposes of shrinking semiconductor devices, the mask opening must be correspondingly small, thereby pushing the limits of the lithography steps used to provide such an opening. In contrast, the mask 134 in FIGS. 6A and B need not meet such tolerances, as the in-process device in those figures allows for a selective etch to remove the conductive material of 122 to the exclusion of insulation 26. (Compare the opening in mask 27 of FIG. 2 used to form via 28 with the opening in mask 134 of FIG. 6A used to clear plug site 130.

If aluminum serves at the conductive material 122, it could be dry etched anisotropically using a plasma containing chlorine, as is known in the art. Exemplary gasses for the plasma include $Cl_2$ and $BCl_3$. Regardless of the specific parameters of this etch, it is performed long enough to recess the exposed portions of conductive structures 120 and 122 to a point below the elevated surface 132. Preferably, the exposed portions of conductive structures 120 and 122 are recessed to a height of 5,000 Angstroms. One result depicted in FIG. 6A is a conductive structure 122 that extends through its interconnect site 126 and up to, but not including, its plug site 130. Another result is that conductive structure 120 has been recessed in all areas pictured except for the plug site 128 under the mask 134.

Figure 7A:
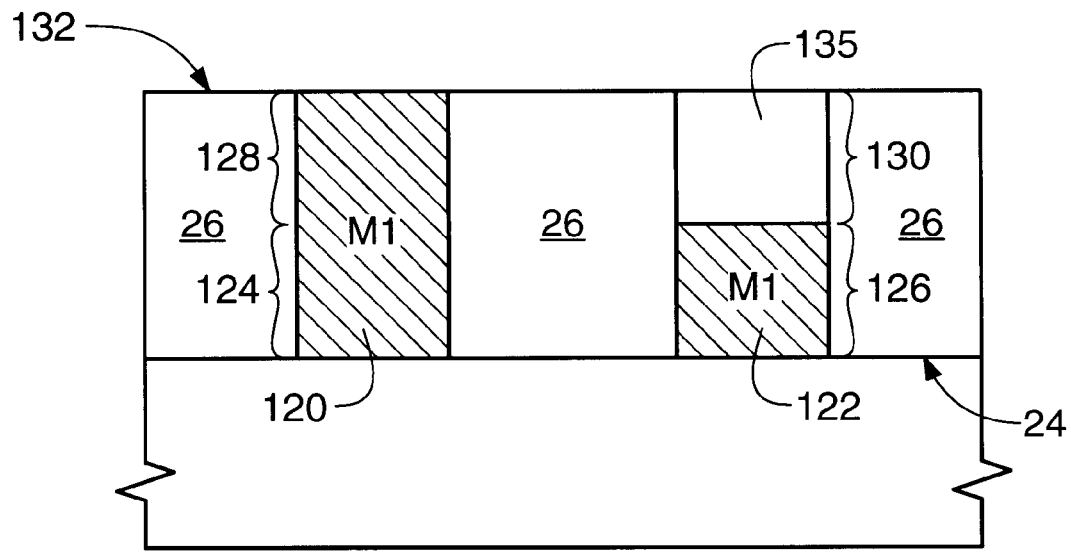
Figure 7B:
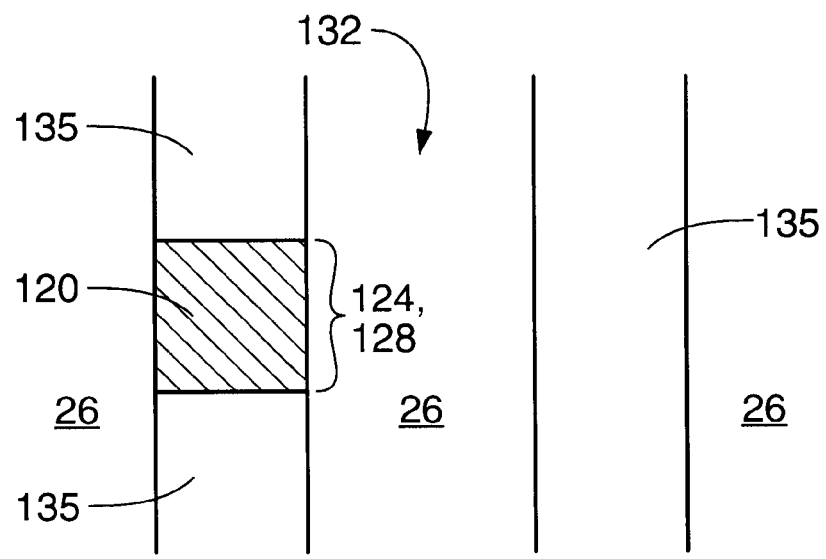

FIGS. 7A and B illustrate that the mask 134 is subsequently removed and plug site 130, along with other portions of conductive structures 120, 122 that were unmasked during the etch, receive an insulation material 135, such as interlayer dielectrics known in the art. Those dielectrics include oxides and, more specifically, may comprise additional BPSG. Accordingly, processes for depositing this insulation material 135 are also known in the art. Filling these areas may also result in depositing extra insulation onto the elevated surface 132 and onto portions of conductive structures reaching that surface, such as plug site 128 of conductive structure 120. In that event, the extra insulation is removed through etching or planarization steps to expose the tops of conductive structures that remain fully extended.

Figure 8A:
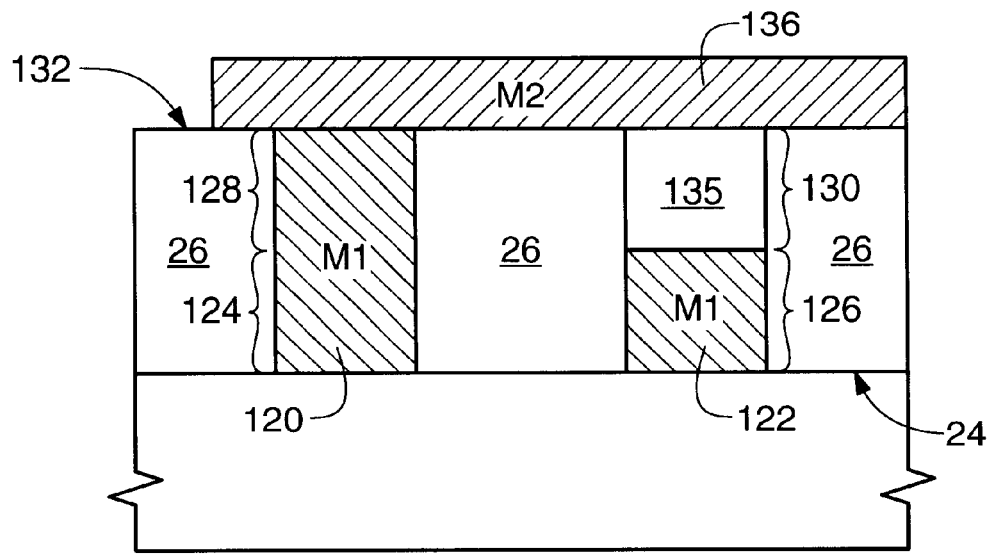
Figure 8B:
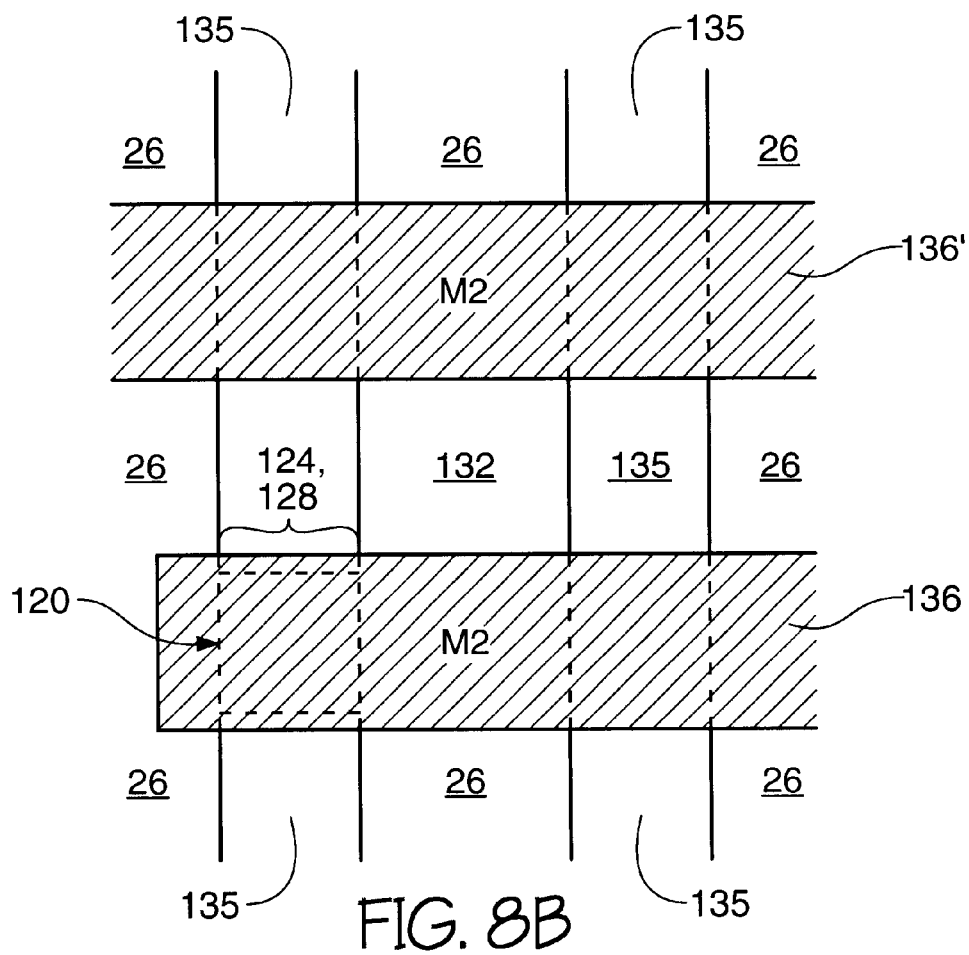

At least one additional interconnect 136 (as well as 136') may then be formed on the elevated surface 132, as seen in FIGS. 8A and 8B. As on the lower surface 24, several interconnects 136, 136' may be formed on this upper level simultaneously as part of a second metal deposition step M2. FIGS. 8A and 8B show that electrical communication may occur between interconnect 136 and conductive structure 120 through the unetched portion thereof. In contrast to the prior art result of FIG. 3, however, eliminating the separate via etch eliminates the polymer 32 that can result from that etch and interfere with electrical communication. Further, if a third level of interconnects is desired, interconnects 136 and 136' can be provided in much the same manner as the methods used for conductive structures 120 and 122, wherein integral plugs can be extended from the conductive structures 136 and 136' at selective sites up to the third level.

Figure 9:
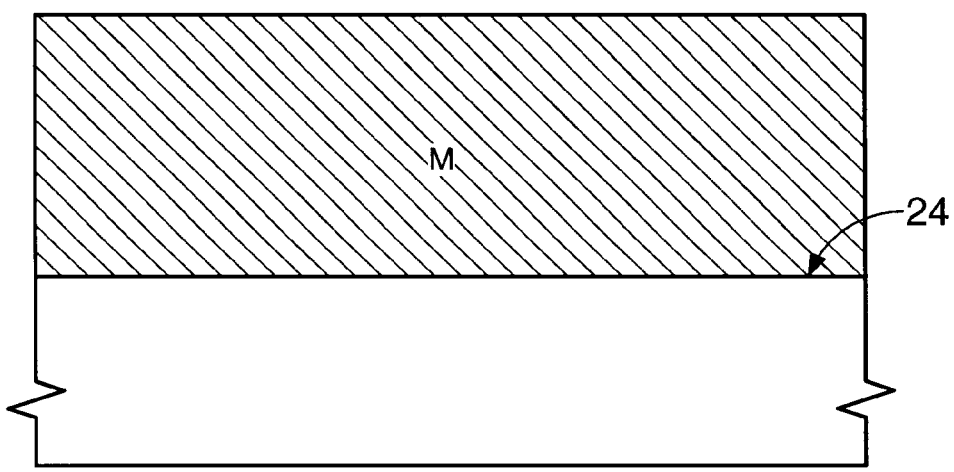
FIGS. 9–11 describe a second exemplary embodiment of the current invention.
Figure 10:
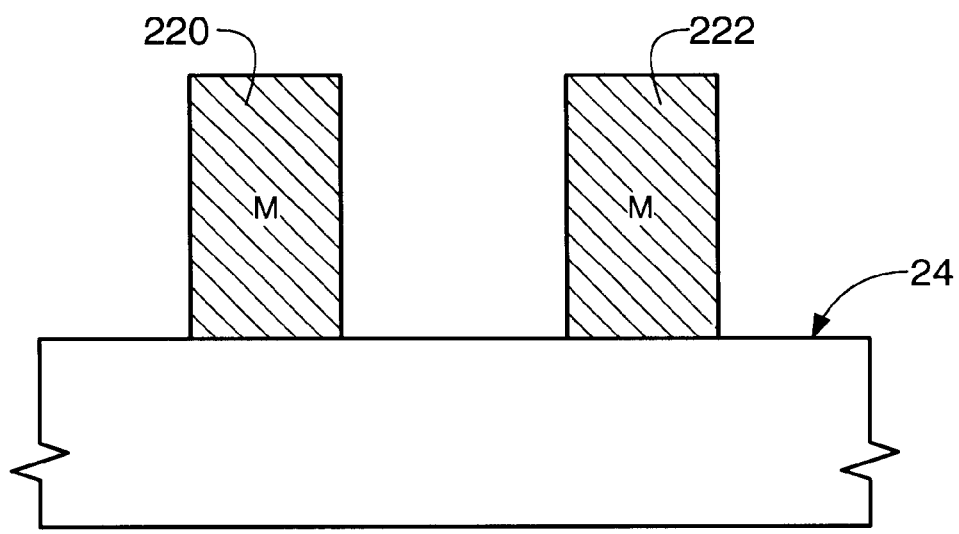
Figure 11:
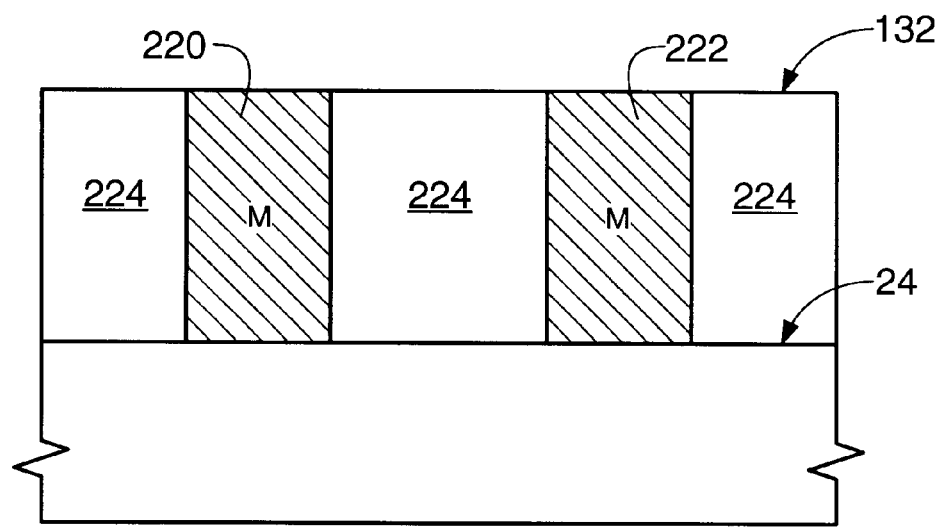

An alternative method of forming the first, second, or any level of interconnects involves a non-damascene process, as shown beginning with FIG. 9. That figure illustrates a conductive layer, preferably metal M, deposited as a continuous layer over a surface 24. The thickness of metal M is generally equal to the height of an interconnect plus an overlying plug. Once again, this thickness is assumed to be 8,000 Angstroms. A patterned mask is then provided over metal M, and an etch is carried out according to the pattern. The mask is then removed. The result is seen in FIG. 10, wherein metal structures 220 and 222 have been formed from the formerly-continuous metal M. FIG. 11 demonstrates that insulation 224 is then provided around the metal structures. This can be achieved with a spin-on-glass process; a process using flowfill, wherein a silane/hydrogen peroxide chemistry allows insulation to literally flow between structures before solidifying; or some other process for providing an oxide. Any amount of insulation 224 appearing over the metal structures 220 and 222 may be removed by planarization or wet or dry etching. The tops of the conductive structures 220 and 222 and the coplanar surface of the insulation 224 once again define an elevated surface 132 configured to receive an additional level of interconnects. Assuming that metal structure 222 is to be isolated at this cross-section, that isolation may be achieved using etch methods as described above, involving recessing selected portions of the metal structure 222 and filling that recess with oxide.

Figure 12:
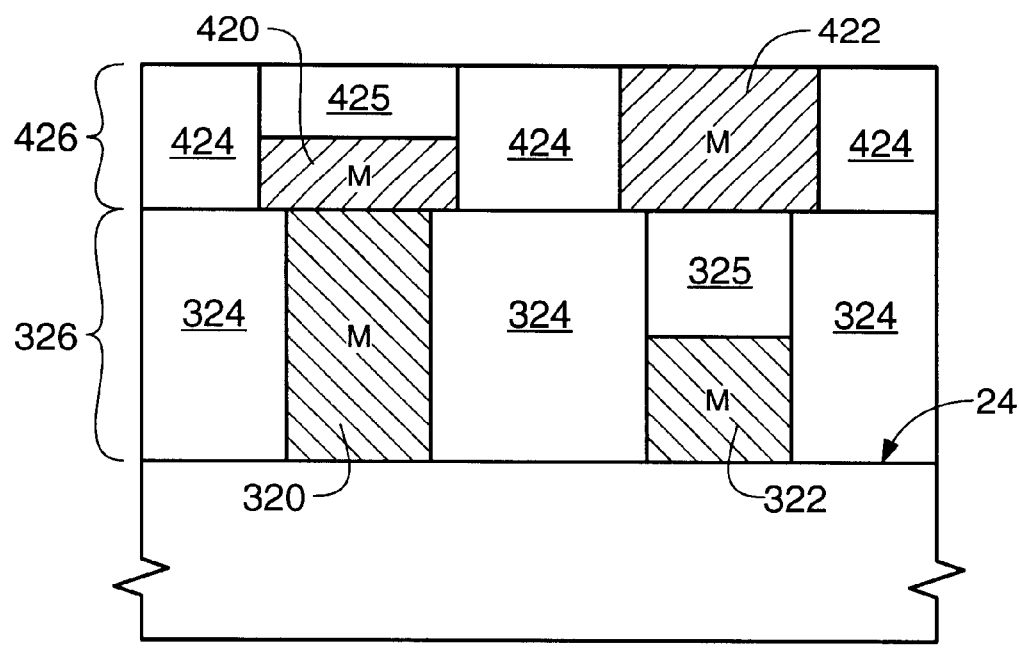
FIG. 12 depicts a third exemplary embodiment of the current invention.

The current invention also includes within its scope processes using a combination of methods to produce combined interconnect/plug structures. For example, the structure in FIG. 12 could be achieved using a damascene-type process (see FIGS. 4–7B and accompanying text) to provide the first interconnect level 326, comprising conductive structures 320 and 322 and insulation portions 324 and 325; whereas the non-damascene process just described above could be used to provide the second interconnect level 426, comprising conductive structures 420 and 422 and insulation portions 424 and 425. This is, in fact, a preferable embodiment, as higher levels of metallization are usually less restricted in terms of their critical dimension, and this non-damascene process lends itself to such kinds of metallization.

Figure 13:
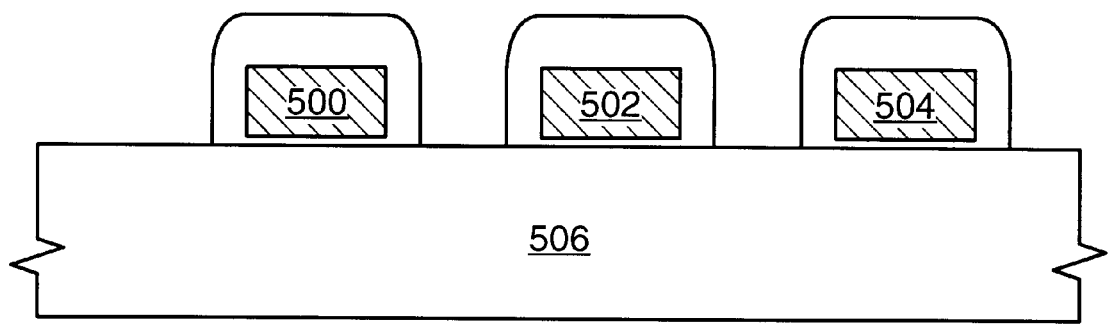
FIGS. 13–19B picture a fourth exemplary embodiment of the current invention, with FIGS. 13, 14, 15A, 16, 17A, 18, and 19A offering cross-sectional views, while FIGS. 15B, 17B, and 19B offer top-down views.
Figure 14:
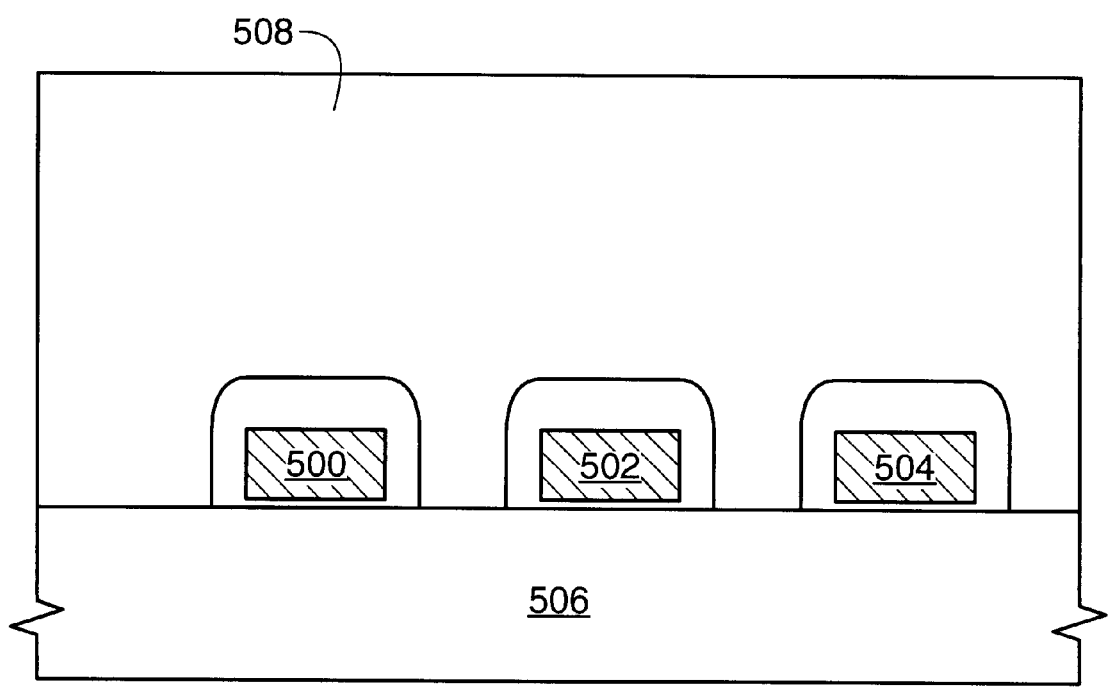
Figure 15A:
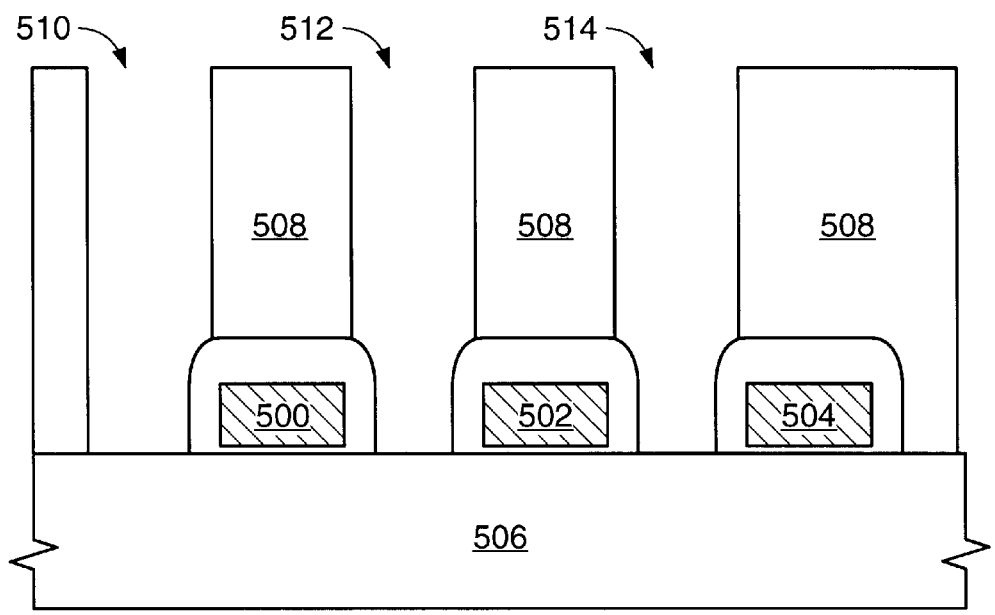
Figure 15B:
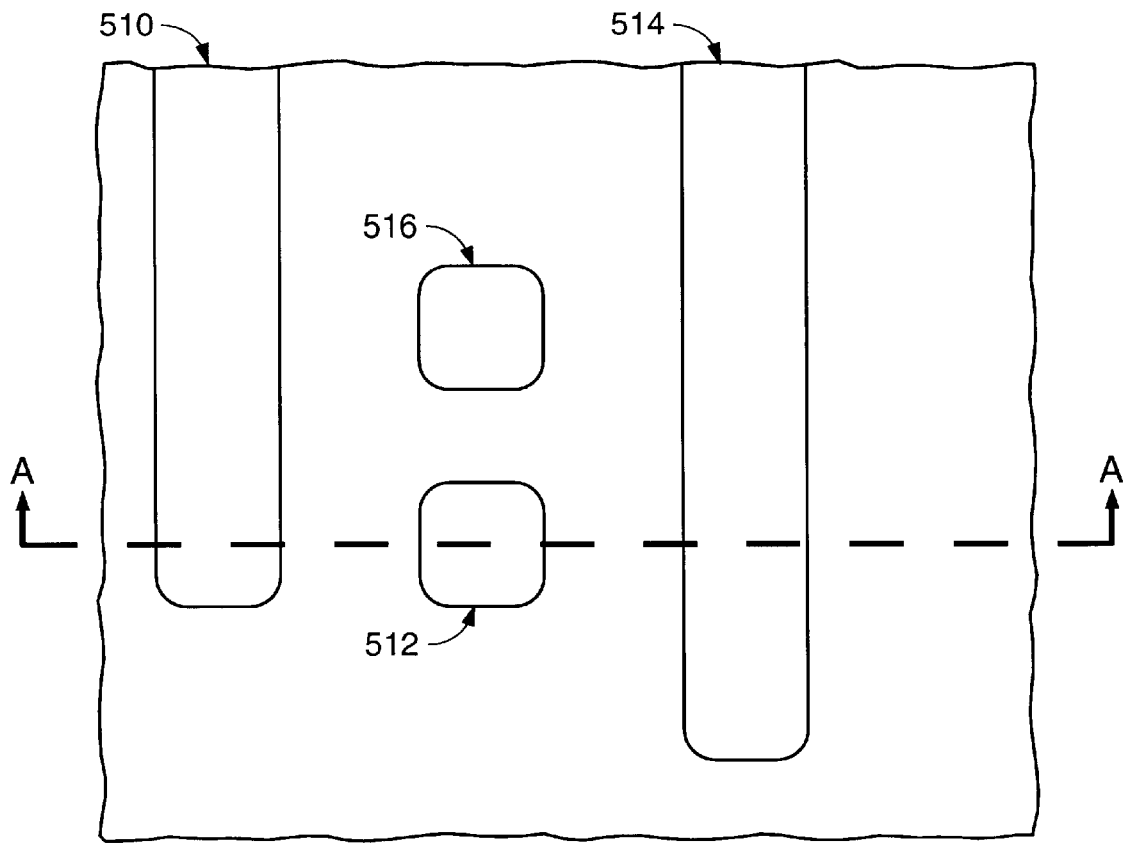

In addition, the current invention is not limited to providing electrical communication between interconnects or other lines or paths. FIG. 13 is the first figure in an embodiment wherein electrical communication is provided between a semiconductor substrate and overlying interconnects. FIG. 13 displays three field-effect transistors 500, 502, and 504 constructed on a substrate 506, portions of which may be doped. FIG. 14 shows that insulation, in this case BPSG 508, is deposited over the substrate 506 and transistors 500, 502, 504 and is subsequently planarized. A patterned mask (not shown) is provided over the BPSG 508, and etching the BPSG 508 as guided by that mask results in the openings 510, 512, and 514 depicted in FIG. 15A. A top-down view of these openings 510, 512, and 514 is offered in FIG. 15B. FIG. 15B also identifies axis A—A; all of the cross-sectional figures of this exemplary embodiment illustrate a cross section along this axis. It can be seen from FIG. 15B's perspective that openings 510 and 514 are elongated trenches that are not necessarily coextensive, whereas opening 512 is a more cylindrical opening. In addition, FIG. 15B reveals another opening 516 that is not revealed in FIG. 15A.

Figure 16:
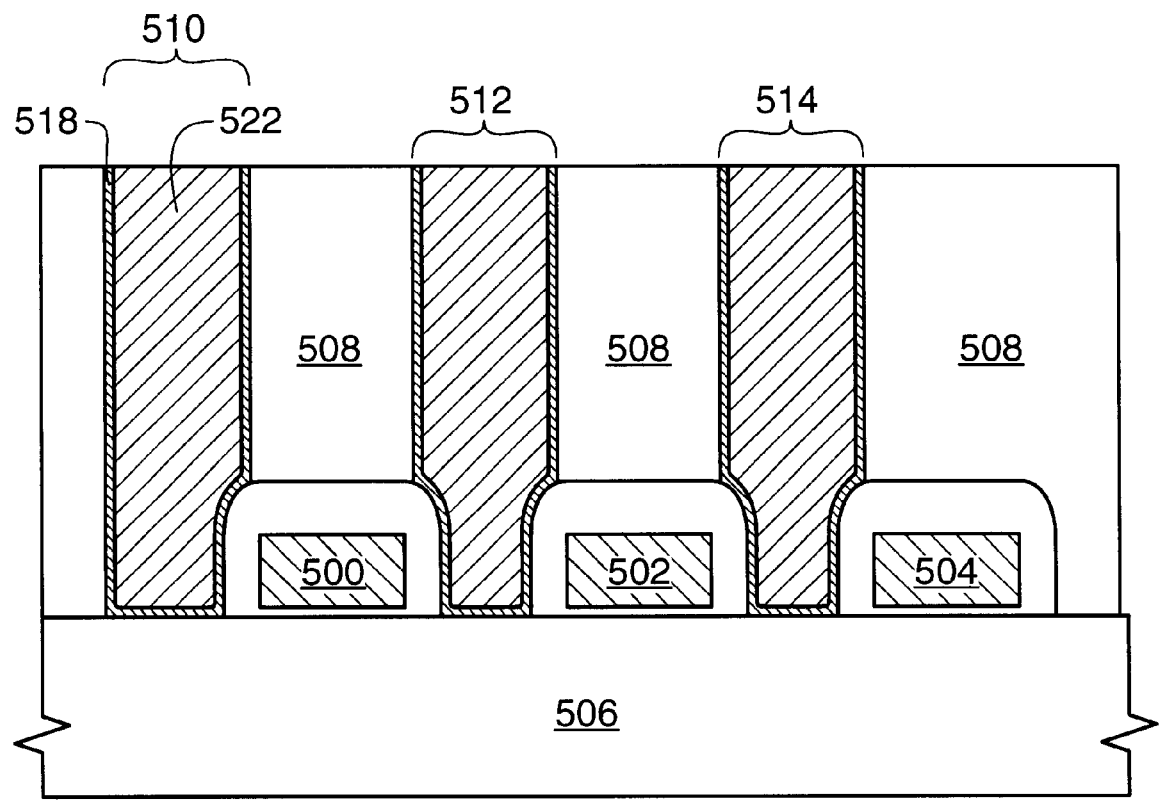

FIG. 16 demonstrates optional steps for this and other embodiments. First, the openings 510, 512, 514, and 516 are lined with a titanium layer 518. At some point in the process, this titanium layer 518 can be sintered at a high temperature, thereby forming titanium silicide at the interface between the titanium layer 518 and the substrate 506, which results in good ohmic contact. In addition, nitrogen can be incorporated into the titanium layer 518 so that it may act as an adhesion layer for the subsequently deposited conductive material. Methods of providing these liners are known in the art. Subsequently, a conductive material 522, assumed to be tungsten or aluminum in this embodiment, is deposited into the openings 510, 512, 514, and 516. Amounts of conductive material 522 that deposit beyond the openings are etched back or removed by planarization.

Figure 17A:
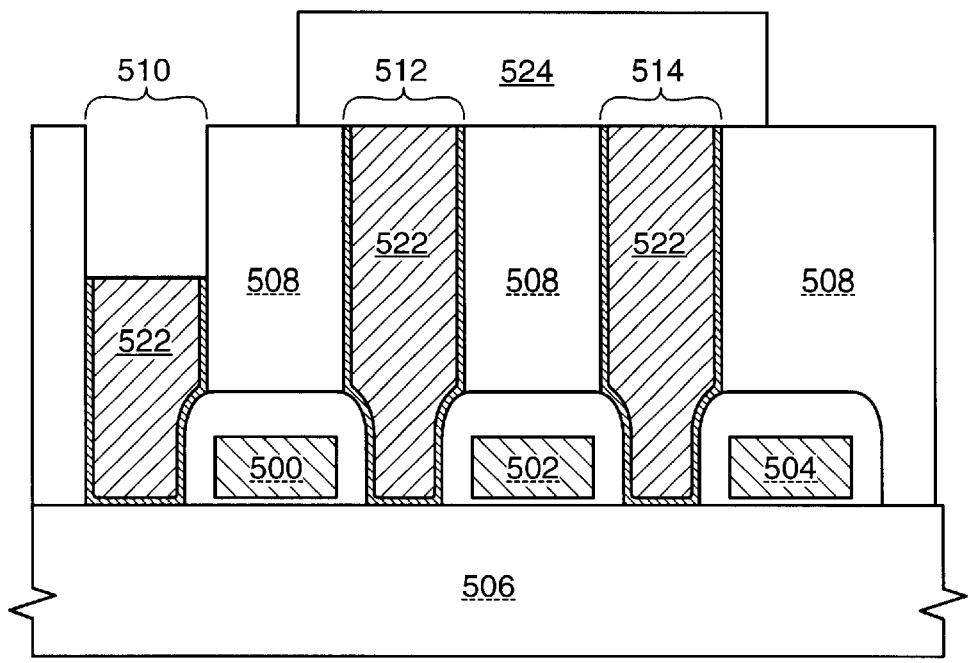
Figure 17B:
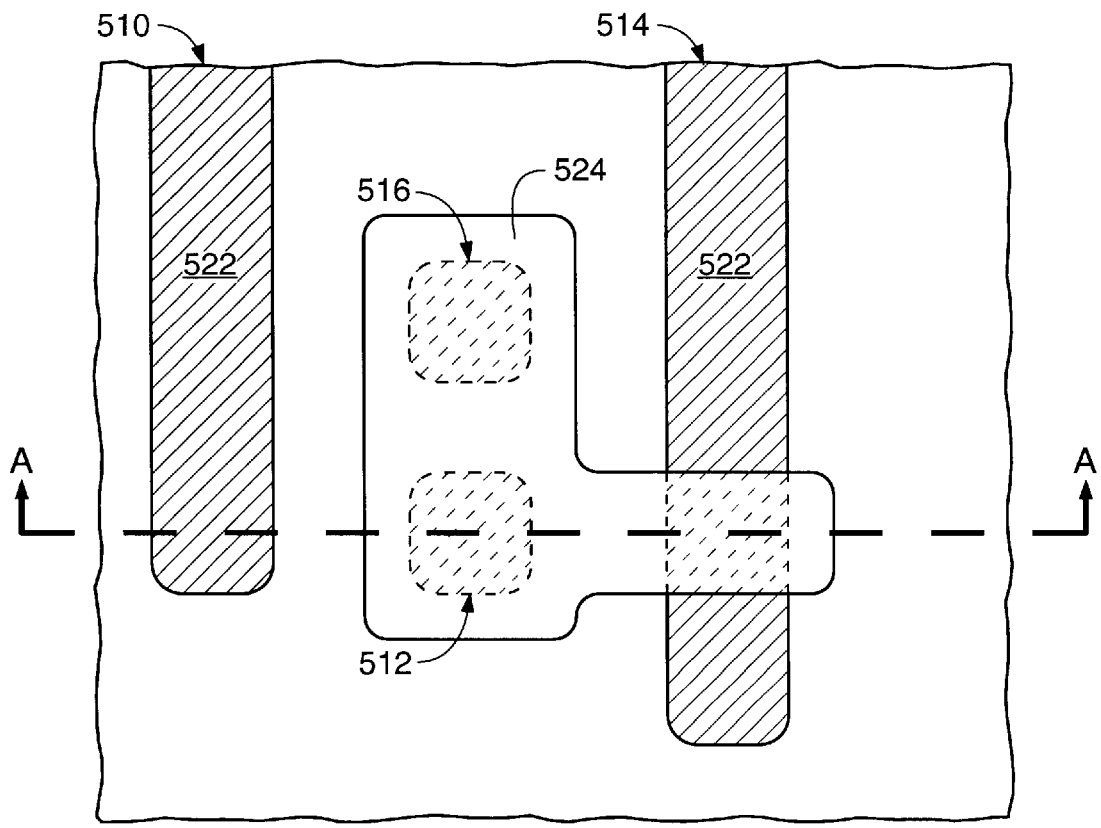

FIG. 17A next shows that areas in which it is desired to maintain electrical access to the substrate 506 from the top of BPSG 508 are protected by patterned photoresist 524, while other portions of the conductive material 522 are left exposed for the subsequent etch step. FIG. 17B offers another perspective that more clearly demonstrates the coverage of a portion of the patterned photoresist 524. Specifically, the photoresist 524 completely covers openings 512 and 516. Photoresist 524 also extends to cover a portion of the conductive material 522 in the trench-shaped opening 514. None of the conductive material 522 in opening 510 is protected by photoresist 524 (at least, none of the conductive material 522 viewable in FIGS. 17A and B is protected). Accordingly, the unprotected portions of conductive material 522 in openings 510 and 514 are etched. The photoresist 524 is subsequently removed.

Figure 18:
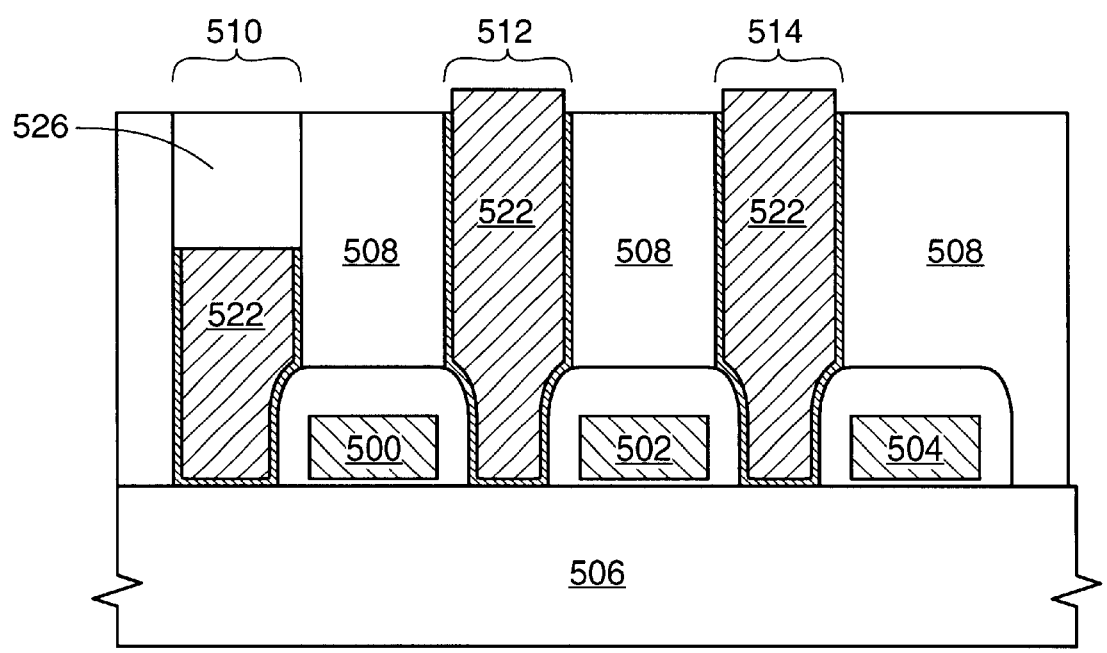

In FIG. 18, the recessed areas of openings 510 (and 514 not shown in this cross section) are filled with oxide 526. That oxide 526 can be etched back, as can the BPSG 508 in order to better expose the "plugs" included as an integral part of the conductive material 522 in openings 512, 514, and 516.

Figure 19A:
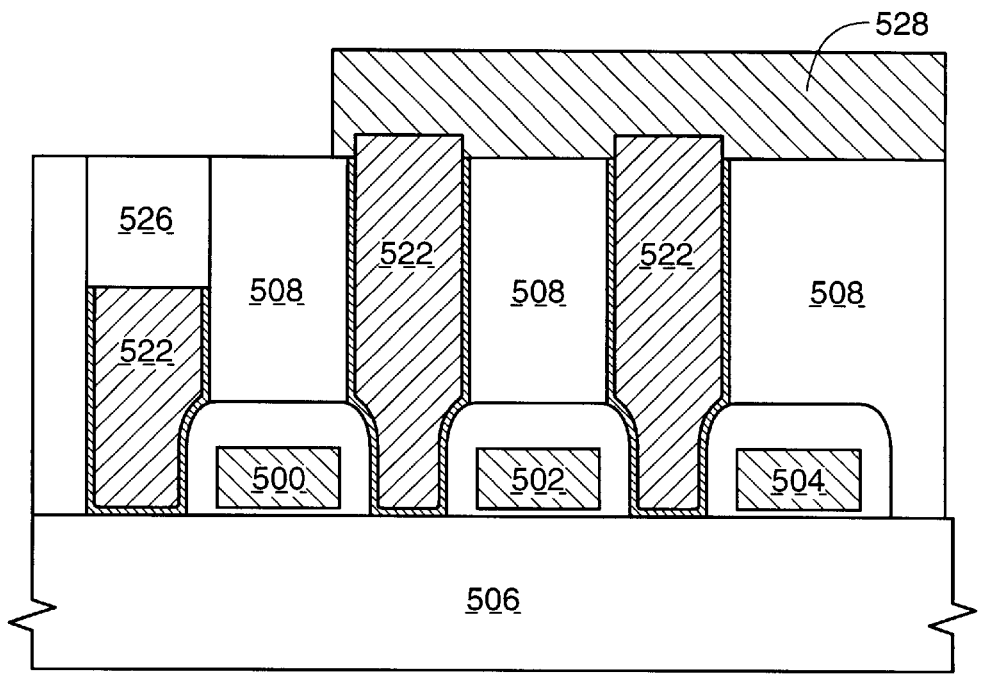
Figure 19B:
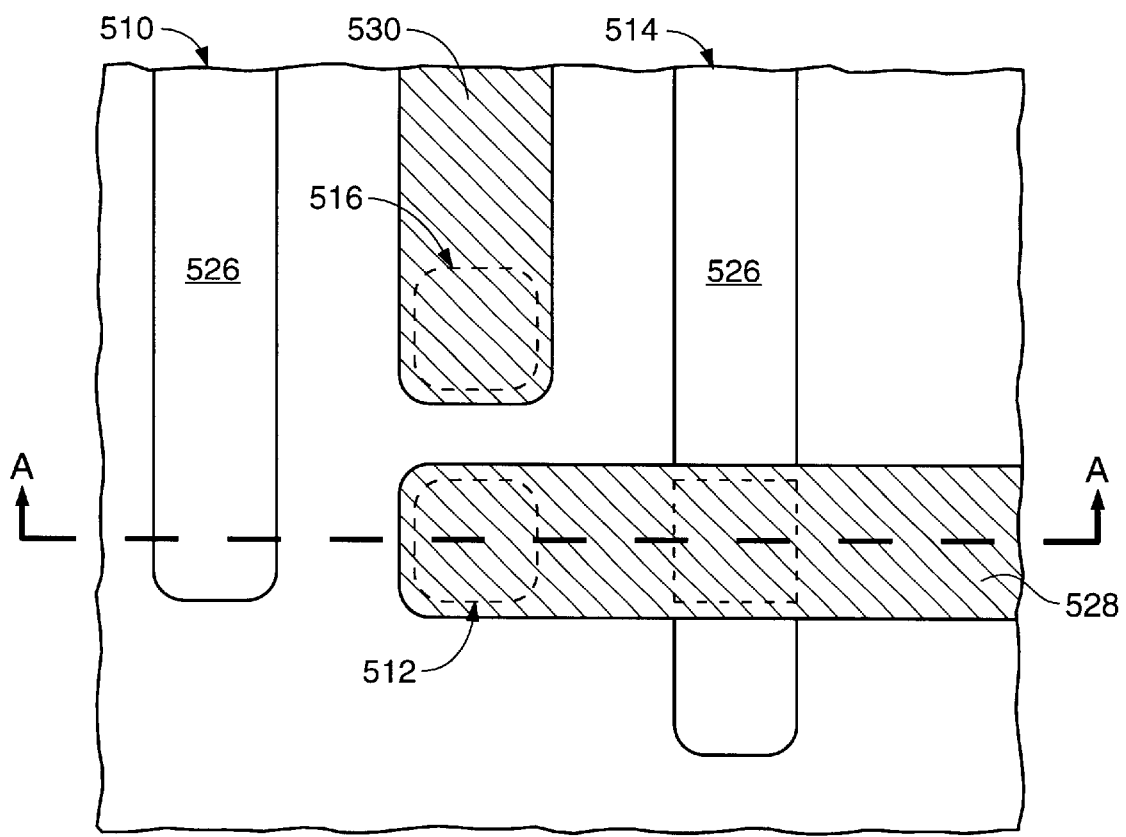

FIGS. 19A and B illustrate that interconnects 528 and 530 can then be provided over the remaining "plugs." For example, interconnect 530 contacts the conductive material 522 in opening 516. A second interconnect 528 contacts the conductive material 522 in opening 512 as well as a portion of the conductive material 522 in opening 514. Other portions of conductive material 522 in opening 514 are covered by oxide 526, as is the conductive material 522 in opening 510.

One skilled in the art can appreciate that, although specific embodiments of this invention have been described above for purposes of illustration, various modifications may be made without departing from the spirit and scope of the invention. For example, it may not be necessary in certain embodiments to recess the interconnect/plug structure if there will be no higher interconnect structure extending thereover. Moreover, while the exemplary embodiments discussed above are explained in terms of multiple layers of interconnects or interconnects electrically communicating with portions of a substrate, the current invention applies to other conductive lines, paths, or conductive elements in general. Further, while at least some exemplary embodiments could be described in terms of a multi-level structure in that a first part of the structure is located in one level of a device and a second part seamless with the first part extends to a second level of the device; exemplary embodiments could also be described as a multi-axial structure, wherein a first part extends primarily along a first axis and an integral second part extends primarily along a second axis, wherein the second axis and first axis are perpendicular. In addition, the present invention may be implemented in a variety of integrated circuit devices such as memory devices, including DRAM and SRAM; logic devices, including those having embedded memory; application specific integrated circuits; microprocessors; microcontrollers; digital signal processors; and the like incorporating a memory array. Accordingly, the invention is not limited except as stated in the claims.

What is claimed is:

1. A method of processing a wafer having an insulation layer flanking conductive paths and configured to receive a patterned first mask on top of said insulation layer, wherein said first mask is configured to expose plug sites within said insulation layer, said method comprising:

allowing said conductive paths to extend to said top of said insulation layer of said wafer; and patterning a second mask on said insulation layer, wherein said second mask is generally inverse to said first mask.

2. The method in claim 1, wherein said step of patterning a second mask comprises masking said plug sites.

3. The method in claim 2, wherein said step of patterning a second mask comprises exposing portions of said conductive paths external to said plug sites.

4. The method in claim 3, wherein said step of patterning a second mask comprises exposing said portions of said conductive paths and portions of said insulation layer external to said plug sites.

5. The method of claim 4, further comprising a step of etching said portions of said conductive paths.

6. The method of claim 5, wherein said etching step further comprises selectively etching said portions of said conductive paths to a general exclusion of said insulation layer.

7. A method of treating an in-process circuit, comprising:

forming a trench from an insulation material;

sputtering an interconnect material into said trench, wherein said sputtering step occurs at a temperature ranging from 510° C. to 520° C.

forming a plug over said interconnect material; and refraining from planarizing said in-process circuit between said sputtering step and said step of forming a plug.

8. The method in claim 7, wherein said sputtering step comprises sputtering aluminum.

9. The method in claim 8, wherein said step of forming a trench comprises forming a trench having a depth sufficient to accommodate a height of an interconnect and a height of a plug anywhere along said trench; and wherein said step of forming a plug comprises:

continuing to sputter aluminum into said trench; and recessing a surface of said aluminum except at at least one region representing at least one respective plug site.

10. A method of constructing a semiconductor device, comprising:

using a damascene process, providing a first plurality of integrated interconnect/plug structures within a first insulation layer of said semiconductor device;

replacing a plug portion of at least one interconnect/plug structure of said first plurality with additional insulation; and providing a plurality of interconnects on said first insulation layer, wherein said step of providing comprises providing a second plurality of integrated interconnect/plug structures, and wherein said step of providing a second plurality of integrated interconnect/plug structures further comprises:

providing a conductive layer on said first insulation layer, wherein said conductive layer has a height defining an interconnect height and a plug height, and etching said second plurality of integrated interconnect/plug structures from said conductive layer, wherein said step of providing a second plurality of integrated interconnect/plug structures comprises providing said second plurality of integrated interconnect/plug structures within a second insulation layer, and wherein said step of providing said second plurality of integrated interconnect/plug structures within a second insulation layer comprises flowing insulation between each of said second plurality of integrated interconnect/plug structures.

11. A method of constructing a semiconductor device, comprising:

using a damascene process, providing a first plurality of integrated interconnect/plug structures within a first insulation layer of said semiconductor device;

replacing a plug portion of at least one interconnect/plug structure of said first plurality with additional insulation; and providing a plurality of interconnects on said first insulation layer, wherein said step of providing comprises providing a second plurality of integrated interconnect/plug structures, and wherein said step of providing a second plurality of integrated interconnect/plug structures further comprises:

providing a conductive layer on said first insulation layer, wherein said conductive layer has a height defining an interconnect height and a plug height, and etching said second plurality of integrated interconnect/plug structures from said conductive layer, wherein said step of providing a second plurality of integrated interconnect/plug structures comprises providing said second plurality of integrated interconnect/plug structures within a second insulation layer, and wherein said step of providing said second plurality of integrated interconnect/plug structures within a second insulation layer comprises spinning glass between each of said second plurality of integrated interconnect/plug structures.

* * * * *

UNITED STATES PATENT AND TRADEMARK OFFICE
CERTIFICATE OF CORRECTION

PATENT NO. : 6,352,916 B1　　　　　　　　　　　　　　　　　　　　　　　Page 1 of 1
DATED : March 5, 2002
INVENTOR(S) : Tang et al.

It is certified that error appears in the above-identified patent and that said Letters Patent is hereby corrected as shown below:

Title page,
Item [54], delete the title and replace it with -- METHOD OF FORMING A MULTI-LEVEL STRUCTURE --.

Column 5,
Lines 27-28, delete "inprocess" and replace it with -- in process --.

Signed and Sealed this

Twenty-sixth Day of November, 2002

Attest:

JAMES E. ROGAN
*Attesting Officer*　　　　　　　*Director of the United States Patent and Trademark Office*